(12) United States Patent  (10) Patent No.: US 7,999,311 B2
Werner  (45) Date of Patent: Aug. 16, 2011

(54) SEMICONDUCTOR DEVICE

(75) Inventor: Wolfgang Werner, Munich (DE)

(73) Assignee: Infineon Technologies Austria AG, Villach (AT)

( * ) Notice: Subject to any disclaimer, the term of this patent is extended or adjusted under 35 U.S.C. 154(b) by 183 days.

(21) Appl. No.: 12/476,077

(22) Filed: Jun. 1, 2009

(65) Prior Publication Data

US 2010/0301408 A1 Dec. 2, 2010

(51) Int. Cl.
*H01L 29/66* (2006.01)
*H01L 21/336* (2006.01)

(52) U.S. Cl. ........................................ 257/330; 438/270

(58) Field of Classification Search ................. 257/330, 257/339, 341, 342, E29.26; 438/270
See application file for complete search history.

(56) References Cited

U.S. PATENT DOCUMENTS

| 7,459,365 | B2 | 12/2008 | Rüb et al. |
| 2007/0002383 | A1 | 1/2007 | Ohmiya et al. |
| 2010/0301408 | A1* | 12/2010 | Werner ......................... 257/330 |

* cited by examiner

*Primary Examiner* — Mark Prenty
(74) *Attorney, Agent, or Firm* — Dicke, Billig & Czaja, PLLC

(57) ABSTRACT

A semiconductor device is disclosed. One embodiment includes a trench within a semiconductor body and a gate insulating structure at opposing sidewalls within the trench. A gate electrode structure adjoins the gate insulating structure within the trench and a dielectric structure adjoins the gate electrode structure within the trench. The gate electrode structure is in contact with the semiconductor body at a bottom side of the trench and is electrically coupled to a drain zone over an element having a voltage blocking capability.

25 Claims, 5 Drawing Sheets

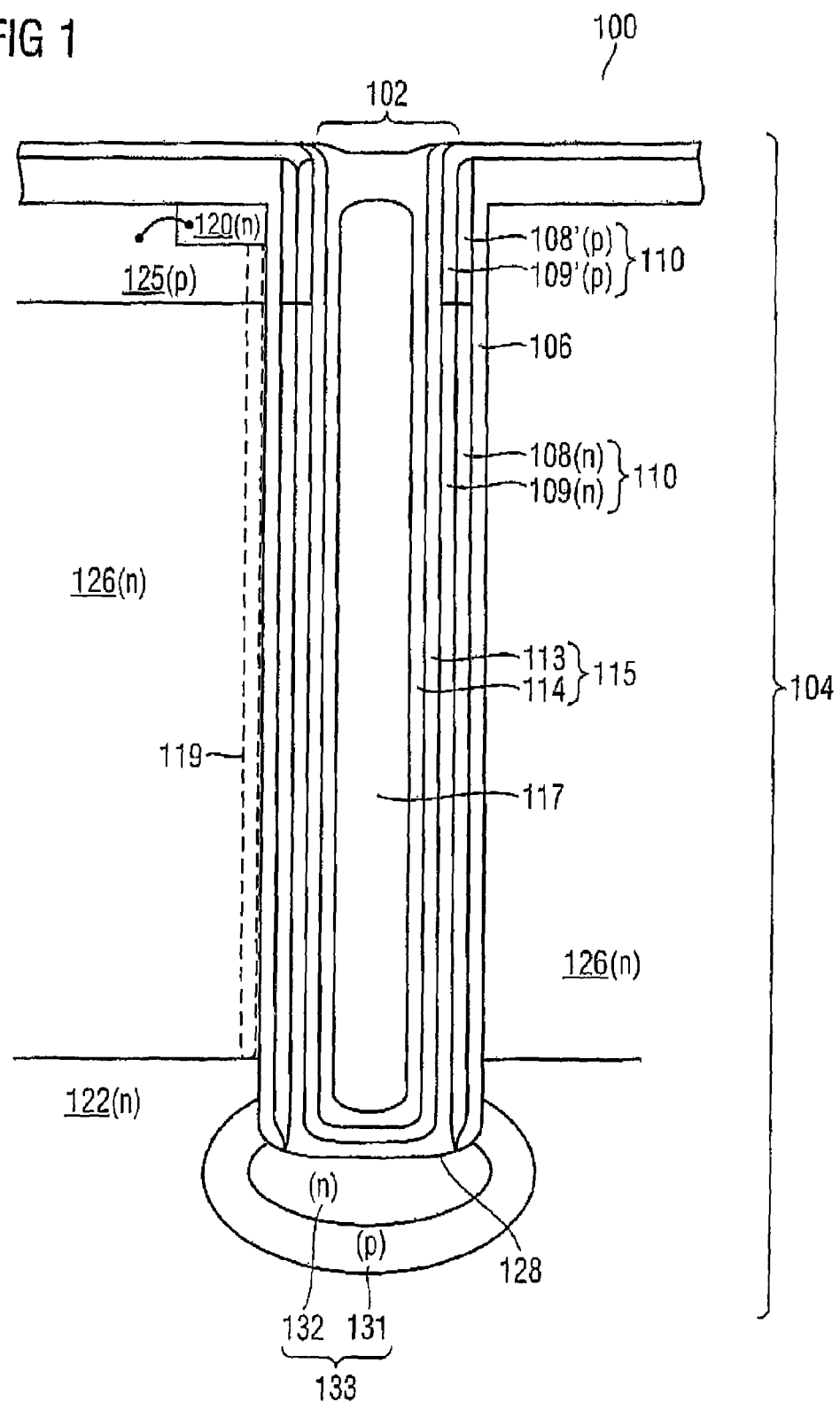

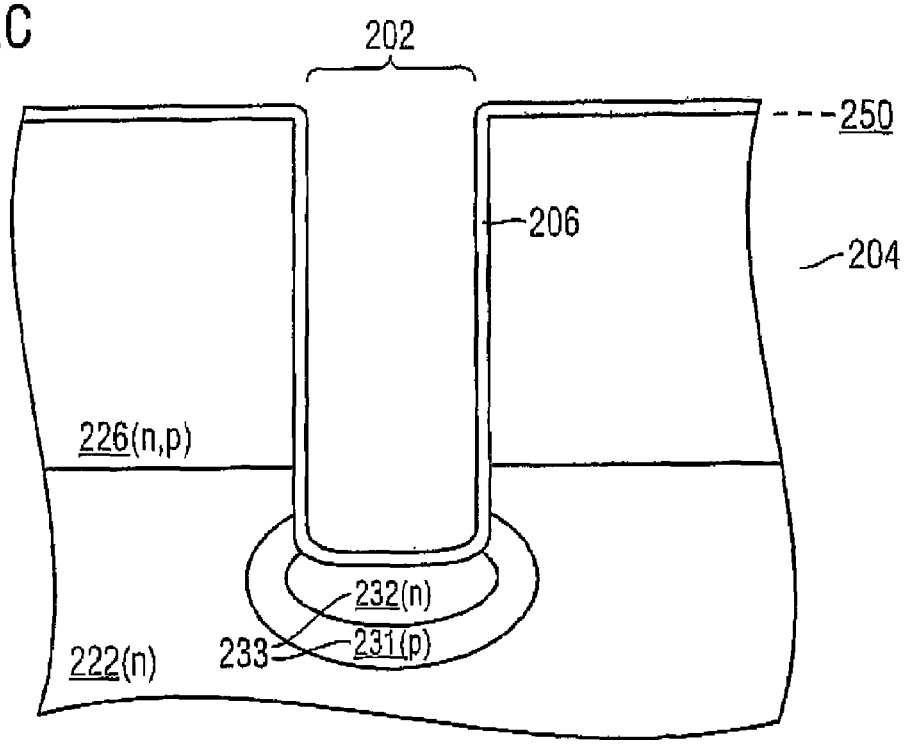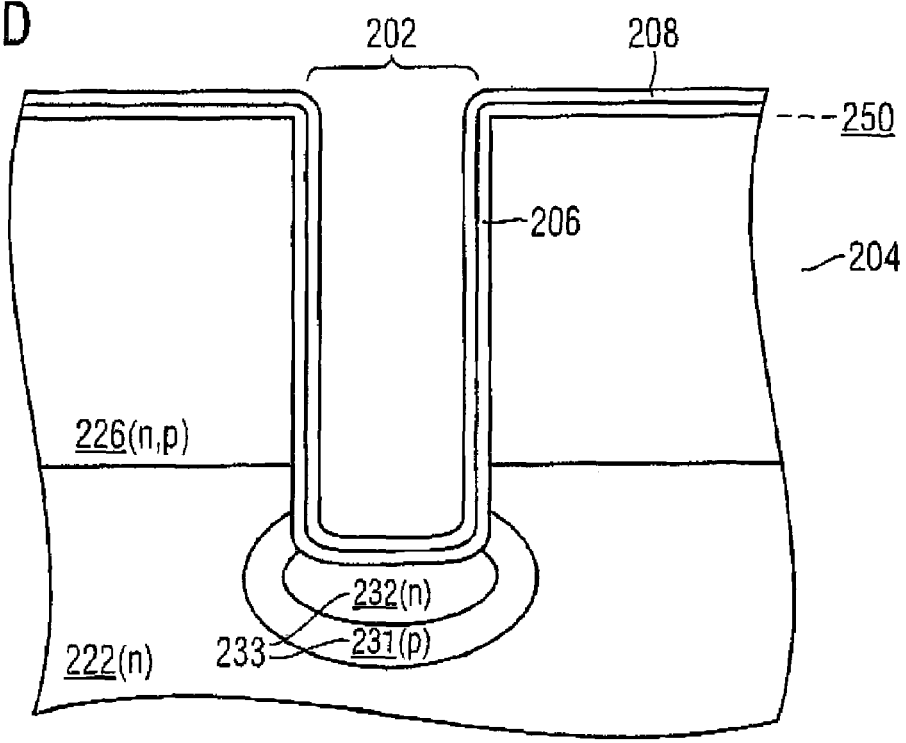

SEMICONDUCTOR DEVICE

BACKGROUND

In semiconductor devices such as power transistors breakdown voltage and on-state resistance depend on parameters such as doping and thickness of a drift zone. Whereas a high doping density and a short extension of a drift zone may lead to a low on-state resistance and a low device breakdown voltage, lower doping densities and longer extensions of the drift zone may lead to a higher on-state resistance and a higher device breakdown voltage. In order to improve both, lowering the on-state resistance and increasing the voltage blocking capability, a decoupling between these two measures is desirable. One configuration of a vertical MOSFET (Metal Oxide Semiconductor Field Effect Transistor) is a TEDFET (Trench Extended Drain Field Effect Transistor) which allows for an improved decoupling of voltage blocking capability and on-state resistance compared to conventional MOSFETs by controlling the conductivity in the drift zone by drift control zones. Manufacture of TEDFETs may include processes having a considerable impact on costs and device reliability.

With regard to a semiconductor device including drift zones and drift control zones, a need exists for an improved device reliability.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 illustrates a cross-sectional view of a portion of a semiconductor device including a drift zone and a drift control zone in accordance with one embodiment.

FIGS. 2A to 2H illustrate schematic cross-sectional views of a portion of a semiconductor body during manufacture of a semiconductor device including a drift zone and a drift control zone.

DETAILED DESCRIPTION

Figure 2A:
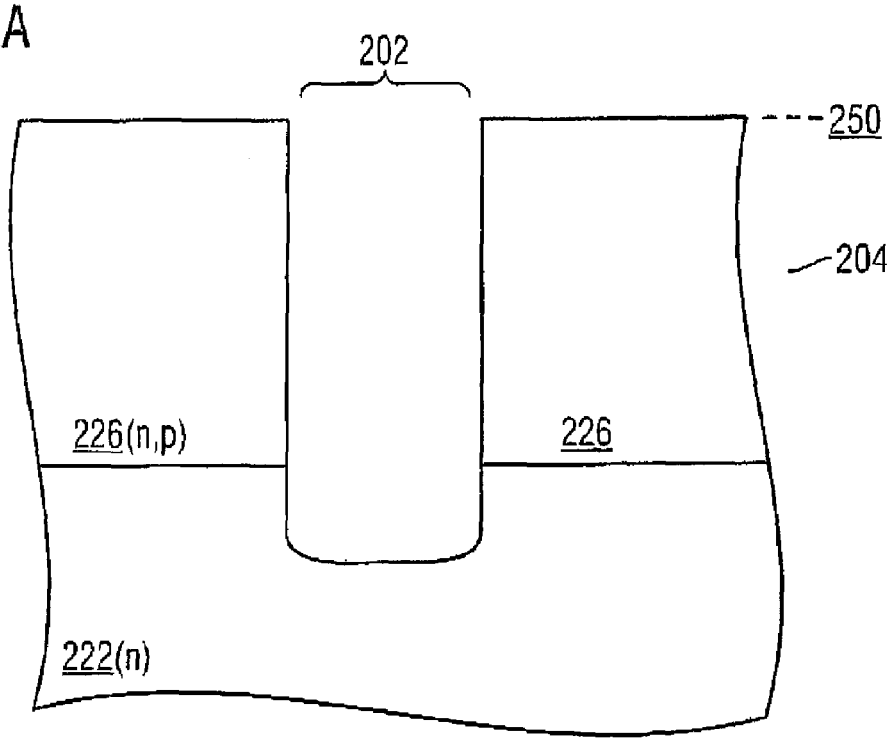

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In one or more embodiments, a semiconductor device as described herein includes a trench within a semiconductor body and a gate insulating structure at opposing sidewalls within the trench. A gate electrode structure adjoins the gate insulating structure within the trench and a dielectric structure adjoins the gate electrode structure within the trench. Furthermore, the gate electrode structure is in contact with the semiconductor body at a bottom side of the trench and is electrically coupled to a drain zone over an element having a voltage blocking capability.

According to one embodiment of a method of manufacturing a semiconductor device as described hereinafter, a trench is formed within a semiconductor body and a gate insulating structure is formed at opposing sidewalls within the trench. A gate electrode structure is formed adjoining the gate insulating structure within the trench, the gate electrode structure being formed in contact with the semiconductor body at a bottom side of the trench. At a bottom side of the trench, the gate electrode structure is electrically coupled to a drain region over an element including a blocking voltage capability. Then, a dielectric structure is formed adjoining the gate electrode structure within the trench.

FIG. 1 illustrates a cross-sectional view of a portion of a semiconductor device 100 such as a TEDFET including a trench 102 formed within a semiconductor body 104. A gate insulating structure 106 is formed at opposing sidewalls within the trench 102. A gate electrode structure 110 which may include a first gate electrode layer having portions 108, 108' of different conductivity type and a second gate electrode layer having portions 109, 109' of different conductivity type adjoins the gate insulating structure 106. A dielectric structure 115 which may include a dielectric layer 113 and a dielectric filling material 114 adjoins the gate electrode structure 110 within the trench 102. Within the dielectric structure 115 a void 117 may be present.

The gate insulating structure 106, the gate electrode structure 110 and the dielectric structure 115 within the trench 102 form a drift control zone configured to control the conductivity of a channel region 119 extending from a source zone 120 to a drain zone 122 through a body region 125 and a drift zone 126. The gate electrode structure 110 is in contact with the semiconductor body 104 at a bottom side 128 of the trench 102 and electrically coupled to the drain zone 122 over an element 133 having a voltage blocking capability. Element 133 may be a diode including regions 131, 132 of different conductivity type.

By controlling the conductivity in the channel region 119 by field-effect via the drift control zone formed within the trench 102, the conductivity in the drift zone 126 may be increased without increasing the doping density within that zone. The increase of the conductivity may be achieved by forming an accumulation zone in the channel region 119 adjoining the gate insulating structure by field-effect or by forming an inversion zone in the channel region 119 by field-effect. A thickness of the gate insulating structure may be chosen such that a required insulation strength between the drift zone 126 and the drift control zone can be achieved taking into account a voltage drop characteristic along the drift zone 126 and the voltage drop characteristic along the gate electrode structure 110 in reverse mode, i.e., when applying a blocking voltage.

In one embodiment illustrated in FIG. 1, portions 108', 109' of the semiconductor gate electrode structure 110 are of different conductivity type than portions 108, 109, i.e., portions 108' and 109' are of p-type and portions 108 and 109 are of n-type. According to another embodiment, the conductivity type, i.e., n-type or p-type, of the regions 108, 108', 109, 109' may be vice versa to the illustration of FIG. 1. Furthermore, a doping density within portions 108', 109' may be higher than in portions 108, 109. A doping density of regions 108, 109 may be less than $10^{15}$ cm$^{-3}$ or even less than $10^{14}$ cm$^{-3}$. A conductivity type of portions 108, 109 of gate electrode structure 110 may also be equal to the conductivity type of portions 108', 109' provided that the doping density in portions 108', 109' is higher than in portions 108, 109.

An interface between regions 108, 108' and accordingly regions 109, 109' may be located in a depth that corresponds or approximately corresponds to the depth of an interface between body region 125 and drift zone 126. The conductivity type of the gate electrode structure 110 may also be independent from the conductivity type of the source and drift zones 120, 122 provided that the gate electrode structure 110 is electrically coupled to the drift zone 122 over the element 133 including a voltage blocking capability.

The doping density of the drift zone 126 may be smaller than the doping density in the body region 125 and may have a value of less than $10^{15}$ cm$^{-3}$ or even less than $10^{14}$ cm$^{-3}$. In the embodiment illustrated in FIG. 1, the conductivity type of the drift zone 126 is n-type and different from the p-type conductivity of body region 125. In this case an accumulation zone may be formed in the channel region 119 in an on-state of the device 100. According to another embodiment, the conductivity type of the drift zone 126 may also comply with the conductivity type of the body region 125. In this case, an inversion zone may be formed in the channel region 119 in an on-state of the device 100.

Device 100 illustrated in the cross-sectional view of FIG. 1 is an example of one embodiment. Further embodiments may include different structural elements.

The gate electrode structure 110 may also be formed of one or more than two semiconductor layers. These semiconductor layers may be non-epitaxial layers such as polycrystalline or amorphous layers. As an example, the gate electrode structure may include a polycrystalline or an amorphous silicon layer. According to another embodiment, the gate electrode structure may include SiC or GaN. Latter materials have a wider band gap than Si leading to a beneficial lower reverse current within the drift control zone.

The dielectric structure may also include a single or more than two dielectric layers such as undoped or doped silicon oxide layers, e.g., BPSG (Boro-Phospho-Silicate-Glass), PSG (Phospho-Silicate-Glass).

The voltage blocking capability of element 133 may be chosen such that in an on-state of device 100 having a low voltage applied to source zone 120 and drain zone 122, e.g., 0 V to source zone 120 and 1 V to drain zone 122 in case of a n-channel MOSFET, and a comparatively higher voltage applied to the gate electrode structure 110, e.g., 10 V of 15 V, a current flow from the gate electrode structure 110 to the drain zone 122 is prevented by the voltage blocking capability of element 133.

FIGS. 2A to 2H illustrate schematic cross-sectional views of a portion of a semiconductor body during manufacture of a semiconductor device such as device 100 of FIG. 1. Apart from elements and process features illustrated with regard to the following cross-sectional views, further processes may be carried out prior or after any one or in between any two of the process stages illustrated with reference to FIGS. 2A to 2H.

Referring to the schematic cross-sectional view of a portion of a semiconductor body 204, a trench 202 is formed within the semiconductor body 204 extending through a drift zone 226 into a drain zone 222. The trench 202 may be formed by an etch process using an etching mask on a surface 250 of the semiconductor body 204, for example.

The semiconductor body 204 may include an epitaxial layer formed on a semiconductor substrate. For example, the drift zone 226 may be grown on a semiconductor substrate including the drain zone 222. The drain zone may be of n-type conductivity and may have a higher doping concentration than the drift zone 226 which may be of either n-type or p-type conductivity. The semiconductor body 204 may be of Si or include Si.

Figure 2B:
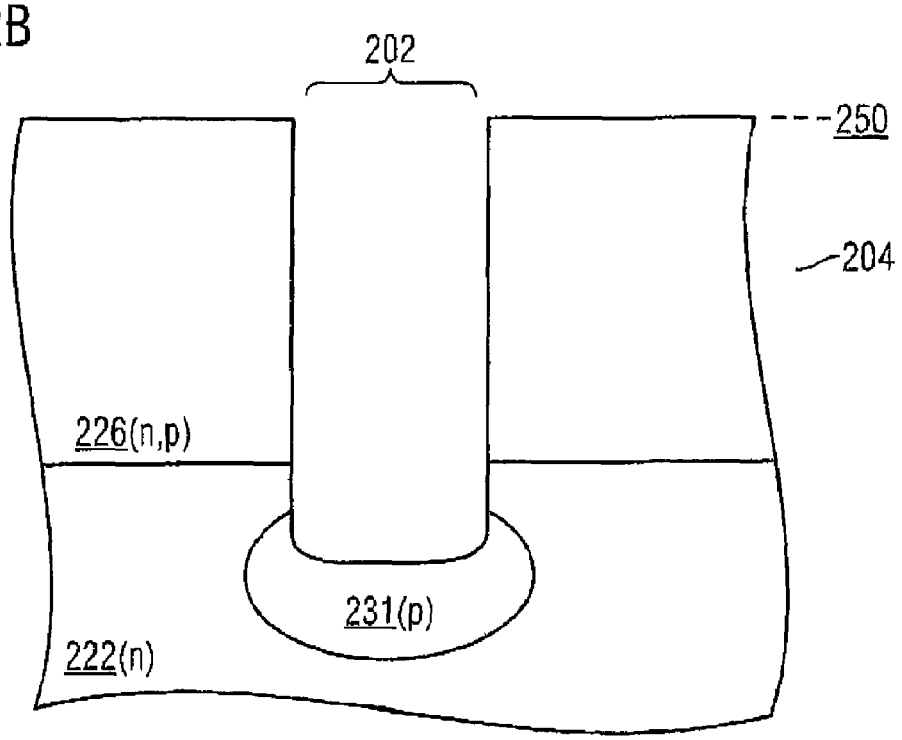

As illustrated in the cross-sectional view of FIG. 2B, p-type dopants such as B are introduced into the semiconductor body 204 in a region 231 at a bottom side of the trench 202. The p-type dopants may be implanted into the semiconductor body 204 using an implant mask which may include a stray oxide, for example (not illustrated in FIG. 2B). The p-type dopants may also be introduced into region 231 by diffusion.

Referring to the schematic cross-sectional view of a portion of the semiconductor body 204 illustrated in FIG. 2C, n-type dopants such as P or As are introduced into a region 232 embedded in region 231. The n-type dopants may be implanted or diffused into region 232 (not illustrated in FIG. 2C). N-type region 232 adjoins to a bottom side of the trench 202. N-Type region 232 together with p-type region 231 constitute a diode 233 as an element having a voltage blocking capability which is electrically coupled to the drain zone 222.

A gate insulating structure 206 is formed at sidewalls and at a bottom side of the trench 202 as well as on the surface 250 of the semiconductor body 204. The gate insulating structure 206 may be formed as a gate oxide layer such as a thermal oxide, i.e., an oxide formed by thermal oxidation in a high temperature process at temperatures in a range between 800° C. to 1200° C., for example. By forming the gate insulating structure 206 of a thermal oxide layer similar to the gate oxide of a known MOS transistor, a beneficial interface having a low defect density may be achieved between the gate insulating structure 206 and the drift zone 226 which may improve the device reliability. When forming the gate insulating structure 206 of a gate oxide layer, access oxygen may be introduced into this layer omitting annealing in a nutritious atmosphere. The gate insulating structure 206 may include one or a plurality of insulating layers.

Referring to the schematic cross-sectional view of FIG. 2D, a first gate electrode layer 208 is formed on the gate insulating structure 206. The first gate electrode layer 208 may be formed by deposition of undoped or slightly doped polysilicon, for example. The first gate electrode layer may also be formed of a different polycrystalline or amorphous semiconductor materials. A thickness of the first gate electrode layer 208 may be in a range of 10 nm to 1000 nm, in one embodiment 50 nm to 100 nm, for example.

Figure 2E:
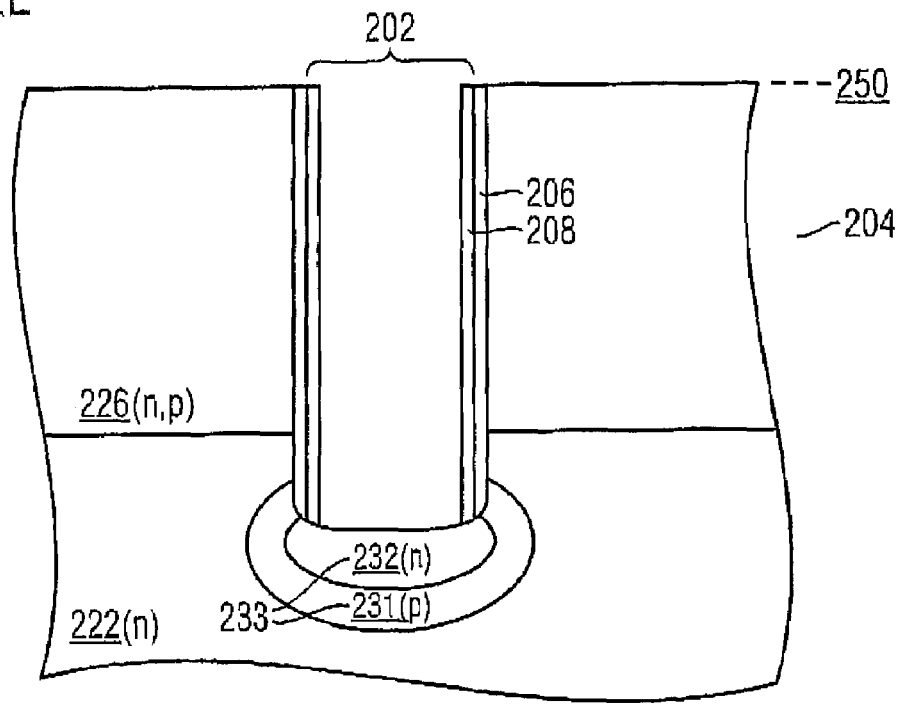

Thereafter, as illustrated in the schematic cross-sectional view of FIG. 2E, the gate insulating structure 206 and the first gate electrode layer 208 are patterned, e.g., by anisotropic etching removing those parts of these elements which are either on the surface 250 of the semiconductor body 204 or on a bottom side of the trench 202. Thus, the gate insulating structure 206 and the first gate electrode layer 208 remain on the sidewalls of the trench 202.

Figure 2F:
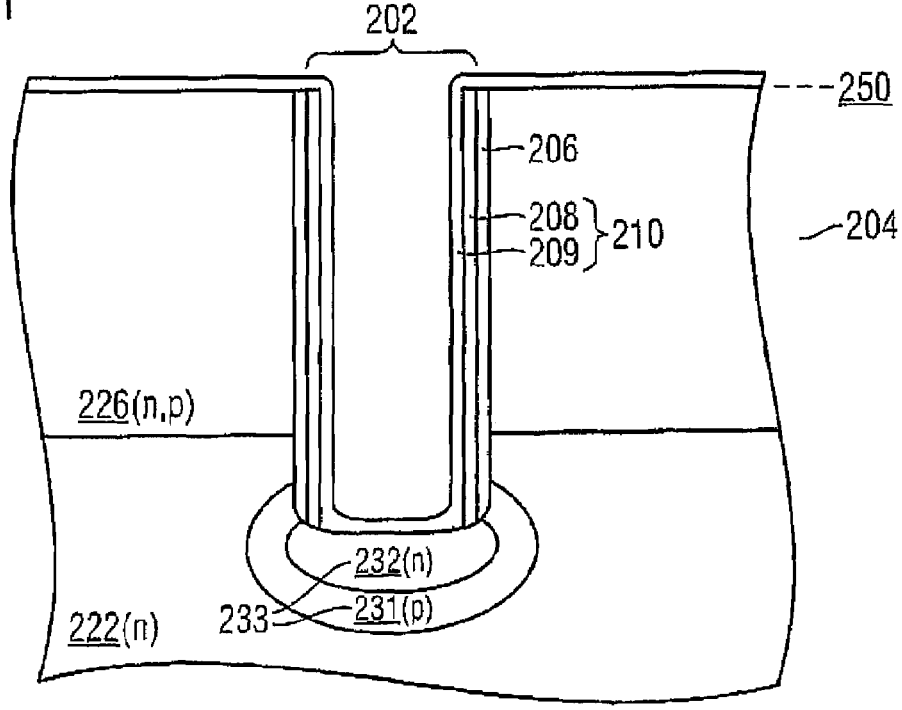

Referring to the schematic cross-sectional view illustrated in FIG. 2F, a second gate electrode layer 209 is formed on the first gate electrode layer 208, at a surface 250 of the semiconductor body 204 and at a bottom side of the trench 202 adjoining the n-type region 232. For example, the second gate electrode layer 209 may be formed of undoped or slightly doped polysilicon having a thickness in a range of 10 nm to 1000 nm, in one embodiment 50 nm to 100 nm, for example. However, another polycrystalline or amorphous semiconductor material may be used as a material for the second gate electrode layer 209. Thus, a gate electrode structure 210 including the first gate electrode layer 208 and the second gate electrode layer 209 is formed. The gate electrode structure 210 is electrically coupled to the drain zone 222 over the diode 233 being an element including a voltage blocking capability configured to prevent a current flow from the electrode structure 210 to the drain zone 222 in an on-state of the finalized device. When forming the first and the second gate electrode layers 208, 209, these layers may be undoped or slightly doped having a dopant concentration of less than $10^{15}$ cm$^{-3}$ or even less than $10^{14}$ cm$^{-3}$, for example.

Figure 2G:
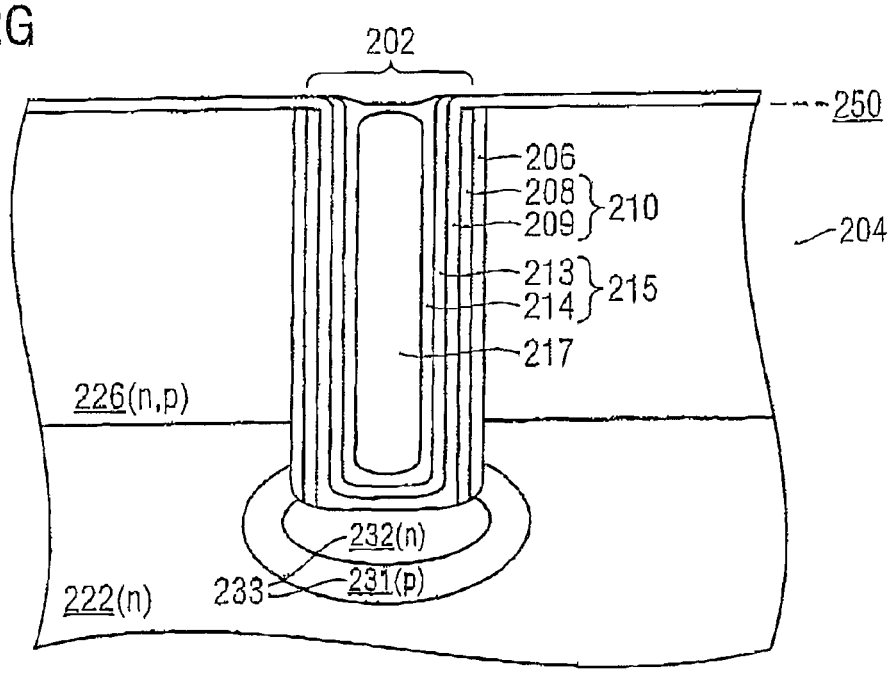

Referring to the cross-sectional view illustrated in FIG. 2G, a first dielectric layer 213 such as an oxide layer is formed on the second gate electrode layer 209. The first dielectric layer 213 may have a thickness within a range of several tens to several hundreds of nanometers, e.g., 50 nm to 300 nm. On the first dielectric layer 213, a second dielectric layer 214, e.g., a doped silicon glass such as BPSG or PSG is formed. A reflow of the second dielectric layer 214 may follow to fill up the trench 202. A void 217 may remain within the second dielectric layer 214 after carrying out the reflow. The first and second dielectric layers 213, 214 constituting dielectric structure 215 are removed from a surface 250 of the semiconductor body 204 by a method such as etching. The dielectric layer 214 may also be replaced by a non-dielectric trench filling material such as polysilicon.

Figure 2H:
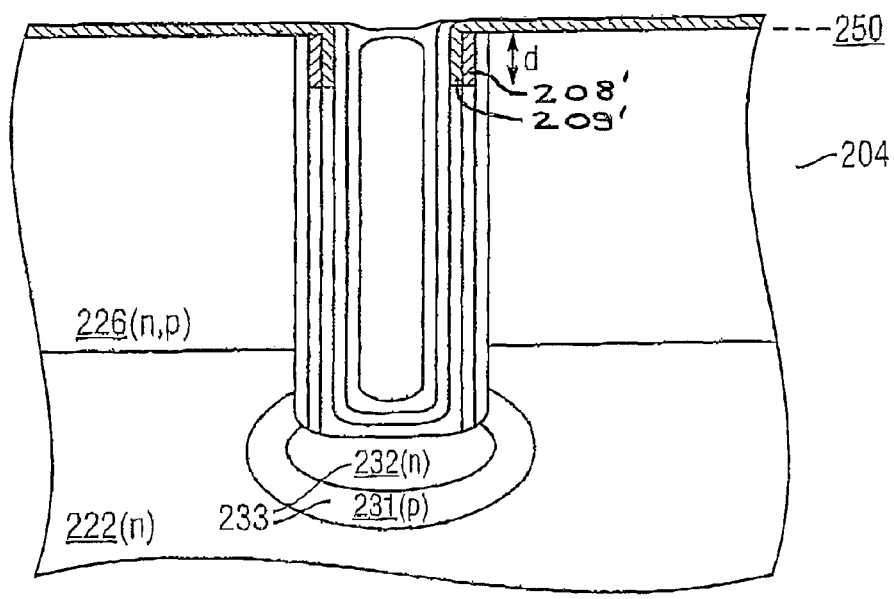

Referring also to the schematic cross-sectional view illustrated in FIG. 2H, dopants are introduced into a portion 208' and a portion 209' of the gate electrode structure.

Propagation of dopants along the sidewalls of the trench 202 may be controlled by adjusting time and temperature of a diffusion process of these dopants. A depth d of portions 208', 209' from the surface 250 of the semiconductor body 204 may be chosen such that it coincides with a depth of a body region which has been previously formed or which may be formed in later processes, for example.

Within the trench 202, a drift control zone including gate insulating structure 206, gate electrode structure 210 and dielectric structure 215 is formed.

Further elements required to finalize device 100, 200 such as a source zone, a body region, and further semiconductor regions may be formed prior, after, in between or together with processes described above. For example, when introducing dopants into regions 231, 232, these dopants may be introduced in further areas of semiconductor body 204, e.g., by a suitable mask, to form additional semiconductor regions, e.g., a source zone or body region.

The embodiments described above with regard to FIGS. 1 and 2 provide beneficial effects such as a low interface charge at the interface between the drift zone and the gate insulating structure when using a thermal oxide for the gate insulating structure similar to known MOS processes. Furthermore, alkaline ions may be gettered within a BPSG layer of the dielectric layer filling in the trench. These effects account for improving the device reliability.

A leakage current of the drift control zone may be reduced by minimizing the thickness of the gate electrode structure to a value in a range of 5 to 30 nm, in one embodiment 10 to 20 nm. The gate electrode structure may also be formed by deposition of amorphous silicon and annealing, whereas the annealing may be a rapid thermal annealing or laser annealing, for example. The leakage current within the drift control zone may also be reduced by annealing the gate electrode structure in a hydrogen ambient at high temperatures such as 1000° C. to 1100° C. leading to large silicon grains of a gate electrode structure made of silicon. These grains may have a diameter of several micrometers, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a trench within a semiconductor body;
a gate insulating structure at opposing sidewalls within the trench;
a gate electrode structure adjoining the gate insulating structure within the trench; and
a dielectric structure adjoining the gate electrode structure within the trench; wherein
the gate electrode structure is in contact with the semiconductor body at a bottom side of the trench and electrically coupled to a drain zone over an element having a voltage blocking capability.

2. The semiconductor device of claim 1, wherein the gate electrode structure comprises a polycrystalline semiconductor material.

3. The semiconductor device of claim 2, wherein the gate electrode structure comprises a first layer of polysilicon and a second layer of polysilicon.

4. The semiconductor device of claim 1, wherein the gate electrode structure comprises an amorphous semiconductor material.

5. The semiconductor device of claim 1, wherein the gate electrode structures comprises at least one of SiC and GaN.

6. The semiconductor device of claim 1, wherein the gate electrode structure comprises a pn junction.

7. The semiconductor device of claim 1, wherein the dielectric structure comprises a void.

8. The semiconductor device of claim 1, comprising wherein the element having a voltage blocking capability is a diode formed within the semiconductor body.

9. The semiconductor device of claim 1, comprising wherein the trench extends through a drift zone into the drain zone.

10. The semiconductor device of claim 1, comprising wherein a thickness of the gate insulating structure is constant along a sidewall of the trench extending from a source region to the drain zone.

11. A semiconductor device, comprising:
a trench within a semiconductor body;
a gate insulating structure at opposing sidewalls within the trench; and
a gate electrode structure adjoining the gate insulating structure within the trench, the gate electrode structure being formed of a polycrystalline or amorphous semiconductor material; wherein
the gate electrode structure is in contact with the semiconductor body at a bottom side of the trench and electrically coupled to a drain zone over an element having a voltage blocking capability.

12. The semiconductor device of claim 11, comprising wherein an order of elements within the trench from one sidewall of the trench to the opposing sidewall of the trench includes the gate insulating structure, the gate electrode structure, a dielectric structure, the gate electrode structure and the gate insulating structure.

13. The semiconductor device of claim 1, wherein the gate insulating structure, dielectric structure, and gate electrode within the trench define a drift control zone.

14. A method for manufacturing a semiconductor device, comprising:
forming a trench within a semiconductor body;
forming a gate insulating structure at opposing sidewalls within the trench;
forming a gate electrode structure adjoining the gate insulating structure within the trench, the gate electrode structure being formed in contact with the semiconductor body at a bottom side of the trench; and
electrically coupling the gate electrode structure at the bottom of the trench to a drain region over an element having a voltage blocking capability and forming a dielectric structure adjoining the gate electrode structure within the trench.

15. The method of claim 14, comprising forming the element having a voltage blocking capability as a diode within the semiconductor body.

16. The method of claim 14, comprising forming the gate electrode structure of a polycrystalline semiconductor material.

17. The method of claim 14, comprising forming the gate electrode structure of an amorphous semiconductor material.

18. The method of claim 14, comprising forming a pn junction within the gate electrode structure.

19. A method for manufacturing a semiconductor device, comprising:
forming a trench within a semiconductor body;
forming a gate insulating structure at opposing sidewalls within the trench;
forming a gate electrode structure adjoining the gate insulating structure within the trench, the gate electrode structure being formed of a polycrystalline or amorphous semiconductor material in contact with the semiconductor body at a bottom side of the trench; and
electrically coupling the gate electrode structure at the bottom of the trench to a drain zone over an element having a voltage blocking capability.

20. The method of claim 19, comprising wherein elements formed within the trench from one sidewall of the trench to the opposing sidewall of the trench include, in the following order, the gate insulating structure, the gate electrode structure, a dielectric structure, the gate electrode structure and the gate insulating structure.

21. The method of claim 19, comprising forming a pn junction within the gate electrode structure.

22. An integrated circuit comprising:
a trench within a semiconductor body;
a drift control zone comprising a gate insulating structure at opposing sidewalls within the trench, a gate electrode structure adjoining the gate insulating structure, and a dielectric structure adjoining the gate electrode structure, wherein the gate electrode structure is in contact with the semiconductor body on a bottom side of the trench and electrically coupled to a drain zone over an element having a voltage blocking capability; and
a channel region adjacent the gate insulating structure and extending through a body region and a drift zone, between a source zone and the drain zone.

23. The integrated circuit of claim 22, comprising:
an accumulation zone formed in the channel region by field effect, configured to increase conductivity of the channel region.

24. The integrated circuit of claim 22, comprising:
wherein the gate insulating structure is configured using a thermal oxide.

25. The integrated circuit of claim 22, comprising:
alkaline ions within a layer of the dielectric structure.

* * * * *